United States Patent [19]

Tojo

[11] 4,013,957

[45] Mar. 22, 1977

[54] CHANNEL-SELECTING APPARATUS FOR A MULTICHANNEL TRANSCEIVER

[75] Inventor: Fumiaki Tojo, Tokyo, Japan

[73] Assignee: Kanda Tsushin Kogyo Co., Ltd., Tokyo, Japan

[22] Filed: Nov. 6, 1975

[21] Appl. No.: 629,562

[30] Foreign Application Priority Data

| | | |
|---|---|---|
| Apr. 26, 1975 | Japan | 50-50248 |
| May 13, 1975 | Japan | 50-55475 |
| May 29, 1975 | Japan | 50-63515 |

[52] U.S. Cl. .............................. 325/25; 325/419; 325/453; 325/455; 325/464
[51] Int. Cl.² .............................................. H04B 1/44
[58] Field of Search ............... 325/15, 17, 20, 21, 325/22, 25, 419–423, 453, 455, 458, 459, 464, 465, 470; 331/1 A, 16, 18; 343/180

[56] References Cited

UNITED STATES PATENTS

| | | | |
|---|---|---|---|
| 3,602,822 | 8/1971 | Evans et al. | 325/470 |
| 3,641,434 | 2/1972 | Yates et al. | 325/25 |
| 3,753,119 | 8/1973 | Close | 325/455 |
| 3,753,142 | 8/1973 | Nardin et al. | 333/1 A |
| 3,803,494 | 4/1974 | Howell et al. | 325/459 |
| 3,845,394 | 10/1974 | Hamada | 325/455 |
| 3,864,637 | 2/1975 | Kanow | 325/470 |

*Primary Examiner*—Robert L. Griffin
*Assistant Examiner*—Jin F. Ng
*Attorney, Agent, or Firm*—Flynn & Frishauf

[57] ABSTRACT

A channel-selecting apparatus for a multichannel transceiver designed to select, upon channel selection, a transmission-reception signal frequency specified for a given channel from among those of all the channels utilizing a phase locked loop system. The apparatus is provided with a channel changeover switch operated to give forth an electric pulse signal, each time one channel is shifted. Electric pulse signals generated upon operation of the switch as many times as the specified channel number being selected are counted by a counter, and then designate that of the matrix-arranged memory addresses of a read-only memory which represents the specified channel number in accordance with the counted number of electric pulse signals. A specified output code signal delivered from the read-only memory according to the address thus designated decides the ratio in which a signal frequency is to be divided by a programmable counter included in the phase locked loop, thereby completing the operation of selecting a desired channel. In case a relatively large number of channels are to be selected in succession, then there are provided an up/down counter and two channel changeover switches for up and down counting respectively or there is installed an additional channel changeover switch assembly designed to produce a certain number of (for example, ten) electric pulse signals, each time the assembly is operated, or, if necessary, both arrangements are used, thereby enabling channels to be changed by a very simple mechanism, even when the signal frequencies specified for the respective channels are not arranged at an equal frequency interval.

20 Claims, 12 Drawing Figures

CHANNEL-SELECTING APPARATUS FOR A MULTICHANNEL TRANSCEIVER

BACKGROUND OF THE INVENTION

The present invention relates to a channel-selecting apparatus for a multichannel transceiver, and more particularly to improvements on a channel-selecting apparatus for a multichannel transceiver which is designed to select any desired channel by changing transmission-reception signal frequencies specified for the respective channels utilizing a phase locked loop system.

The prior art practical channel-selecting apparatus for a mutlichannel transceiver is generally provided with a multipole-multiposition type rotary changeover switch and is so designed that a specified code signal representing any selected channel number is generated upon operation of said changeover switch and said specified code signal is conducted to a programmable counter included in the phase locked loop so as to decide the ratio in which said counter divides its input signal frequency, thereby picking up any desired channel. However, the prior art channel-selecting apparatus of the above-mentioned mechanism has the following drawbacks. Namely, the specified code signal generally consists of a binary coded decimal signal. Since, in this case, a 4-pole-10-position type rotary changeover switch is required to denote any decimal numeral of the first place, the larger the number of channels being selected, not only the more complicated the mechanism of an assembly of said rotary changeover switches, but also the larger the space occupied by the switch assembly.

Further as is well known to those skilled in the art, when the ratio in which a signal frequency is divided by the programmable counter is changed in turn by the successive operation of said rotary changeover switch, then the frequencies of local oscillation signals generated for the respective channels by the phase locked loop are successively shifted at an equal frequency interval on the basis of a unit frequency interval defined by a signal frequency given forth by the later described fundamental signal oscillator included in the phase locked loop. Where, therefore, transmission-reception signal frequencies specified for the respective channels and in consequence local oscillation signal frequencies for said channels are all arranged at an equal frequency interval, there is not raised any problem in selecting a desired channel. According to the frequency assignment adopted for the American 23-channel citizen band transceiver, however, transmission-reception signal frequencies $f_t$ specified for the respective channels and in consequence local oscillation signal frequencies $f_0$ for said channels are not arranged at an equal frequency interval (namely, different frequency intervals of 10 kHz, 20 kHz and 30 kHz appear in some places of both frequency arrangements) as shown in Table 1 below.

Table 1

| Channel | $f_t$ (MHz) | $f_0$ (MHz) |
|---|---|---|
| 1 | 26.965 | 38.240 |
| 2 | 26.975 | 38.250 |
| 3 | 26.985 | 38.260 |
| 4 | 27.005 | 38.280 |
| 5 | 27.015 | 38.290 |
| 6 | 27.025 | 38.300 |
| 7 | 27.035 | 38.310 |
| 8 | 27.055 | 38.330 |
| 9 | 27.065 | 38.340 |
| 10 | 27.075 | 38.350 |
| 11 | 27.085 | 38.360 |
| 12 | 27.105 | 28.280 |
| 13 | 27.115 | 38.390 |
| 14 | 27.125 | 38.400 |
| 15 | 27.135 | 38.410 |
| 16 | 27.155 | 38.430 |
| 17 | 27.165 | 38.440 |
| 18 | 27.175 | 38.450 |
| 19 | 27.185 | 38.460 |
| 20 | 27.205 | 38.480 |
| 21 | 27.215 | 38.490 |
| 22 | 27.225 | 38.500 |
| 23 | 27.255 | 38.530 |

Moreover, said 23 channels are numbered in increasing order, starting with those having smaller allotted frequencies. Where it is a legal obligation to indicate these channel numbers, then the undermentioned difficulties arise. Above all, the ratios of frequency division by the programmable counter which are specified for the respective channels are not in consecutive order. Namely, some exceptional frequency division ratios can not be used in channel selection. As the result, coincidence does not take place between the channel numbers displayed by the successive operation of the rotary changeover switch and an advance in the ratios of frequency division by the programmable counter, thus making it practically impossible to select any of the channels whose numbers are indicated by decimal numerals of two or more places by applying the above-mentioned type rotary changeover switch to the numerals of each place.

It is accordingly the object of this invention to provide a channel-selecting apparatus for a multichannel transceiver, the channel-selecting switch assembly of which is far more simplified than in the prior art channel-selecting apparatus regardless of the number of channels being selected and which is readily applicable even when transmission-reception signal frequencies specified for the respective channels are not arranged at an equal frequency interval.

SUMMARY OF THE INVENTION

A channel-selecting apparatus according to a preferred embodiment of this invention for a multichannel transceiver comprises channel changeover switch means including a switch operative to generate an electric pulse signal each time it is operated; counter means coupled with the switch means to count electric pulse signals delivered therefrom; a read-only memory device provided with at least as many memory addresses as channels being selected and coupled with the counter means to have the memory address representing a selected channel number designated by the count made by the counter means; and a phase locked loop circuitry coupled with the read-only memory device to give forth a local oscillation signal having a frequency assigned to any channel being selected in response to a specified output code signal delivered from the memory device in accordance with the designated address thereof.

A channel-selecting apparatus of the above-mentioned construction has the advantage of far more simplifying the channel-selecting switch assembly than in the prior art channel-selecting apparatus regardless of the number of channels being selected. Further, the channel-selecting apparatus of this invention is characterized in that counter means and a read-only memory device are provided between the channel changeover switch means and phase locked loop circuitry, and the frequencies of local oscillation signals generated for selected channels by the phase locked loop circuitry are not directly determined by electric pulse signals produced upon operation of the changeover switch means as is the case with the prior art channel-selecting apparatus, but that said electric pulse signals are once converted into signals representing the selected channel numbers which in turn are changed into specified code signals, thereafter determining the frequencies of local oscillation signals delivered for the selected channels by the phase locked loop circuitry. Therefore, the channel-selecting apparatus of this invention is applicable to a multichannel transceiver even when the transmission-reception signal frequencies specified for the respective channels are not arranged at an equal frequency interval.

Where a relatively large number of channels are to be selected, a channel-selecting apparatus according to other embodiments of this invention is provided with an up/down counter replaced for the counter means and two switch means of the same type as the switch means of the first embodiment for up and down counting respectively, or an additional channel changeover switch assembly designed to give forth a certain number of (for example, ten) electric pulse signals, each time said assembly is operated, or if necessary, both arrangemtns, thereby offering the advantage of quickly selecting desired channels regardless of their number.

DESCRIPTION OF THE PREFERRED EMBODIMENTS

Figure 1:
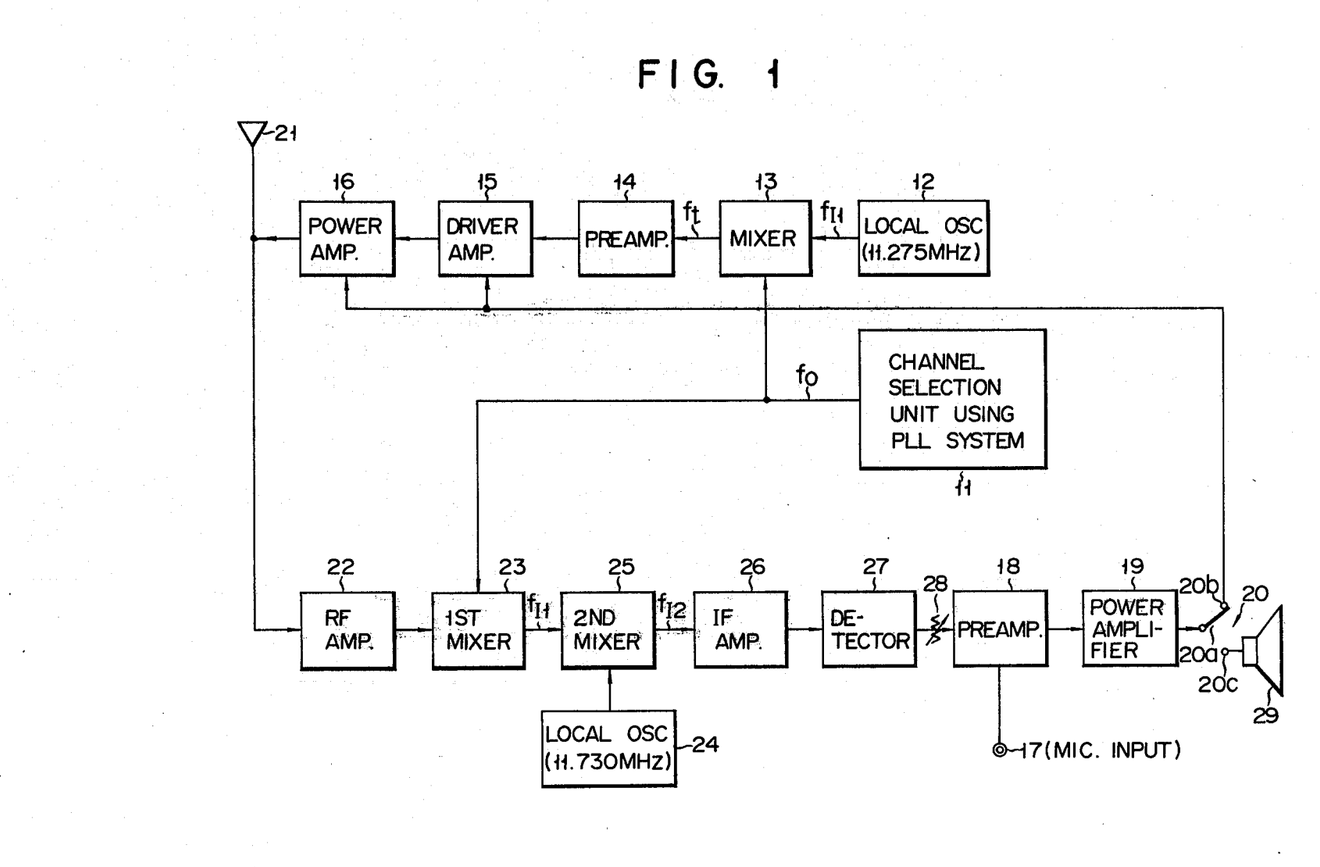
FIG. 1 is a schematic block circuit diagram of a multichannel transceiver using a phase locked loop system.

Before describing the embodiments of this invention, the arrangement of an entire multichannel transceiver including a phase locked loop system used as a local oscillator for producing local oscillation signals for the respective channels will not be briefly outlined by reference to FIG. 1 for better understanding of a channel-selecting apparatus of this invention.

FIG. 1 is a schematic block circuit diagram of the previously mentioned 23-channel double superheterodyne type citizen band transceiver now used in the United States of America. Referential numeral 11 in FIG. 1 denotes a channel-selection unit using a phase locked loop (hereinafter abbreviated as "PLL") designed selectively to generate local oscillation signals having frequencies specified for desired channels from among those listed in Table 1 above. At the time of transmission, a local oscillation signal having a frequency $f_0$ (Table 1) assigned to a selected channel which is derived from the channel selection unit 11 by selective operation of a channel changeover switch included in said unit 11 is supplied to a mixer 13 together with a local oscillation signal generated by a local oscillator 12 at a frequency $f_{t1}$ (11.275 MHz in this embodiment) equal to a first intermediate frequency. As the result, the mixer 13 produces, on the basis of the so-called beat phenomenon, a carrier signal whose frequency $f_t$ (Table 1) is equal to a difference $f_0 - f_{t1}$ between the frequency of a local oscillation signal generated by the channel selection unit 11 and that of a local oscillation signal delivered from the local oscillator 12.

The carrier signal $f_t$ thus obtained is appropriately amplified by a preamplifier 14 and conducted to a driver amplifier 15 and power amplifier 16 in turn. In this case, the sections of the driver amplifier 15 and power amplifier 16 jointly act to amplitude-modulate the carrier signal $f_t$ supplied through the preamplifier 14 with a modulation signal having an audible frequency like that of a voice which is supplied from a microphone input terminal 17, appropriately amplified by a preamplifier 18 and power amplifier 19, and finally delivered from a transmission-reception changeover switch 20 (said switch 20 is shown in a state of transmission, but at the time of reception, a movable contact 20a is switched over from a fixed contact 20b to a fixed contact 20c).

A transmission wave consisting of such modulated wave is radiated from an antenna 21 into the open air.

At the time of reception, the movable contact 20a of the transmission-reception changeover switch 20 is switched over, as described above, from the fixed contact 20b to the fixed contact 20c, and the channel changeover switch included therein as in the case of transmission is so selectively operated that a local oscillation signal having a frequency $f_0$ assigned to a selected channel is delivered from the channel selection unit 11. A signal received through the antenna 21 for the selected channel is amplified by a radio frequency amplifier 22, supplied to a first mixer 23 together with a local oscillation signal produced by the channel selection unit 11 at a frequency specified for the selected channel, and converted into a signal having the first intermediate frequency $f_{t1}$ of 11.275 MHz due to the aforesaid beat phenomenon. The first intermediate frequency signal $f_{t1}$ delivered from the first mixer 23 is further supplied to a second mixer 25 together with a local oscillation signal given forth by a local oscillator 24 at a frequency of 11.730 MHz and is converted into a signal having a desired second or final intermediate frequency $f_{I2}$ of 455 kHz due to said beat phenomenon. The second intermediate frequency signal $f_{I2}$ consisting of an amplitude modulated wave is amplified by an intermediate frequency amplifier 26 and conducted to an amplitude detector 27 acting to shunt the 455 kHz carrier signal component and deliver only a desired amplitude modulated component of audible frequencies. The audible frequency signal component thus obtained passes through a volume controller 28, preamplifier 18, power amplifier 19 and transmission-reception changeover switch 20 and is reproduced through a loudspeaker 29 to be made audible.

This invention relates to improvement on the channel selection unit 11 included in the multichannel transceiver having the arrangement of FIG. 1.

A channel-selecting apparatus according to the preferred embodiments of this invention for use with a multichannel transceiver will now be detailed by reference to FIGS. 2 to 11.

Figure 2:
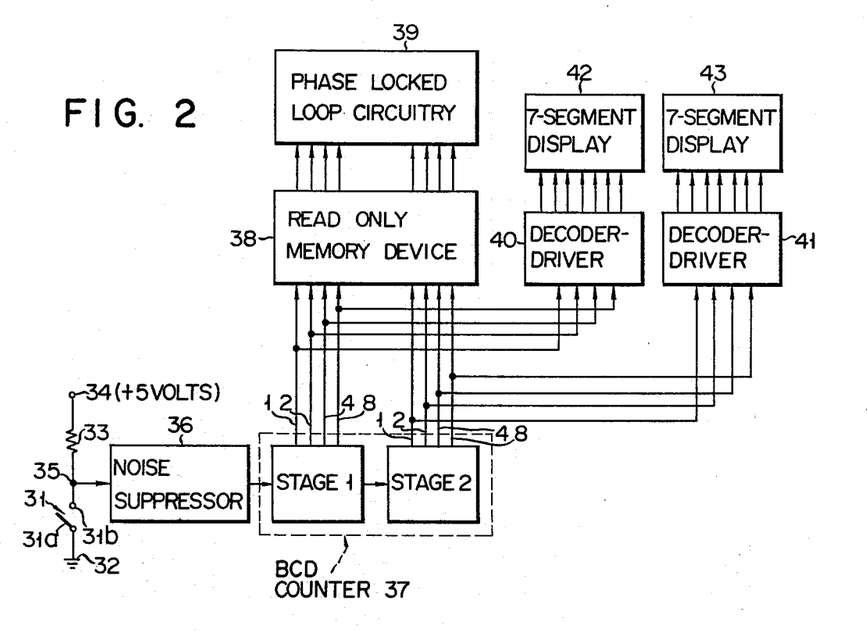
FIG. 2 is a schematic block circuit diagram of a channel-selecting apparatus according to one embodiment of the invention for use with a multichannel transceiver.

FIG. 2 is a schematic block circuit diagram of a channel-selecting apparatus according to one of said preferred embodiments. With this embodiment, a normally open type signal throw switch 31 of simplest arrangement formed of a single movable contact 31a and a single fixed contact 31b is used as a channel changeover switch. The normally open type channel changeover switch 31 is closed only when the depressed movable contact 31a is pressed against the fixed contact 31b at the time of channel selection. The moment a depressing force is released, the movable contact 31a is automatically removed from the fixed contact 31b to keep the channel changeover switch 31 open again. One contact of said switch 31, for example, the movable contact 31a is connected to a grounded negative DC source terminal 32 and the other fixed contact 31b is connected to a positive DC source terminal 34 having a voltage of, for example, 5 volts through a resistor 33 of about 1 K$\Omega$.

Under this arrangement, depression of the movable contact 31a of the channel changeover switch 31 causes a potential at a junction 35 between the fixed contact 31b and resistor 33 to be changed from a potential at the positive DC source terminal 34 to that of the grounded negative DC source terminal 32. Thus negative-going pulses are provided from the junction 35 each time the switch 31 is manipulated in the above-mentioned manner. Negative-going pulses thus obtained pass through a noise suppressor 36, provided if necessary, such as a conventional integrator comprising a resistor and a capacitor, and are supplied to a binary coded decimal (hereinafter referred to as "BCD") counter 37 which comprises a first or front stage for counting decimal numerals of 0 to 9 of the first place and a second or rear stage cascade connected to said first counter stage so as to count decimal numerals of 00 to 90 of the second place. The first and second stages of the BCD counter 37 are respectively provided with four terminals for giving forth four output signals bearing 1, 2, 4 and 8 binary weights.

Where the channel changeover switch 31 is constructed of a conventional mechanical type, the above-mentioned negative-going pulses are contaminated by noise components due to chattering taking place each time the movable contact 31a is pressed against the fixed contact 31b. In this case, therefore, it is desired to provide a noise suppressor 36 in order to eliminate said noise components. Conversely where the channel noise changeover switch 31 comprises an electronic switch utilizing the Hall effect, then the negative-going pulses are substantially free from noise components, eliminating the necessity of providing the noise suppressor 36.

Figure 3:
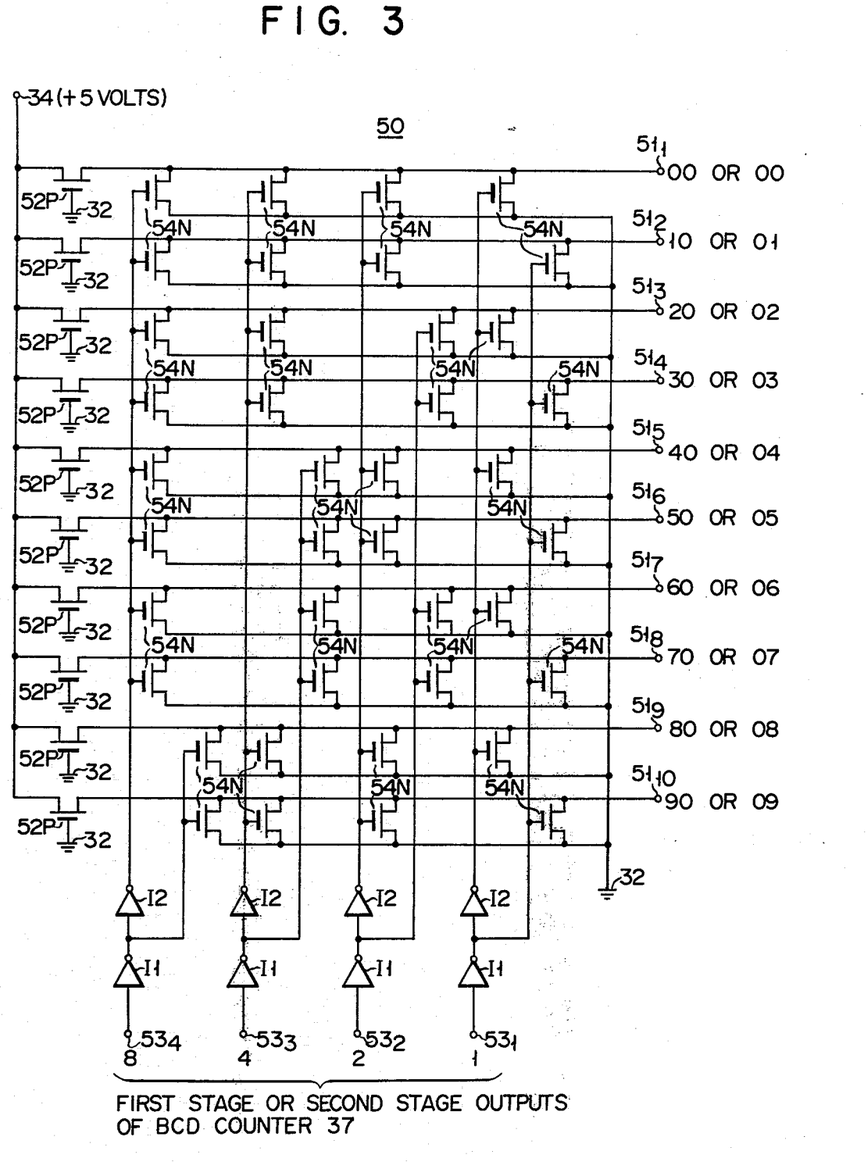
FIG. 3 shows a practical circuit arrangement of a BCD-to-decimal decoder included in the read-only memory device of FIG. 2.
Figure 4A:
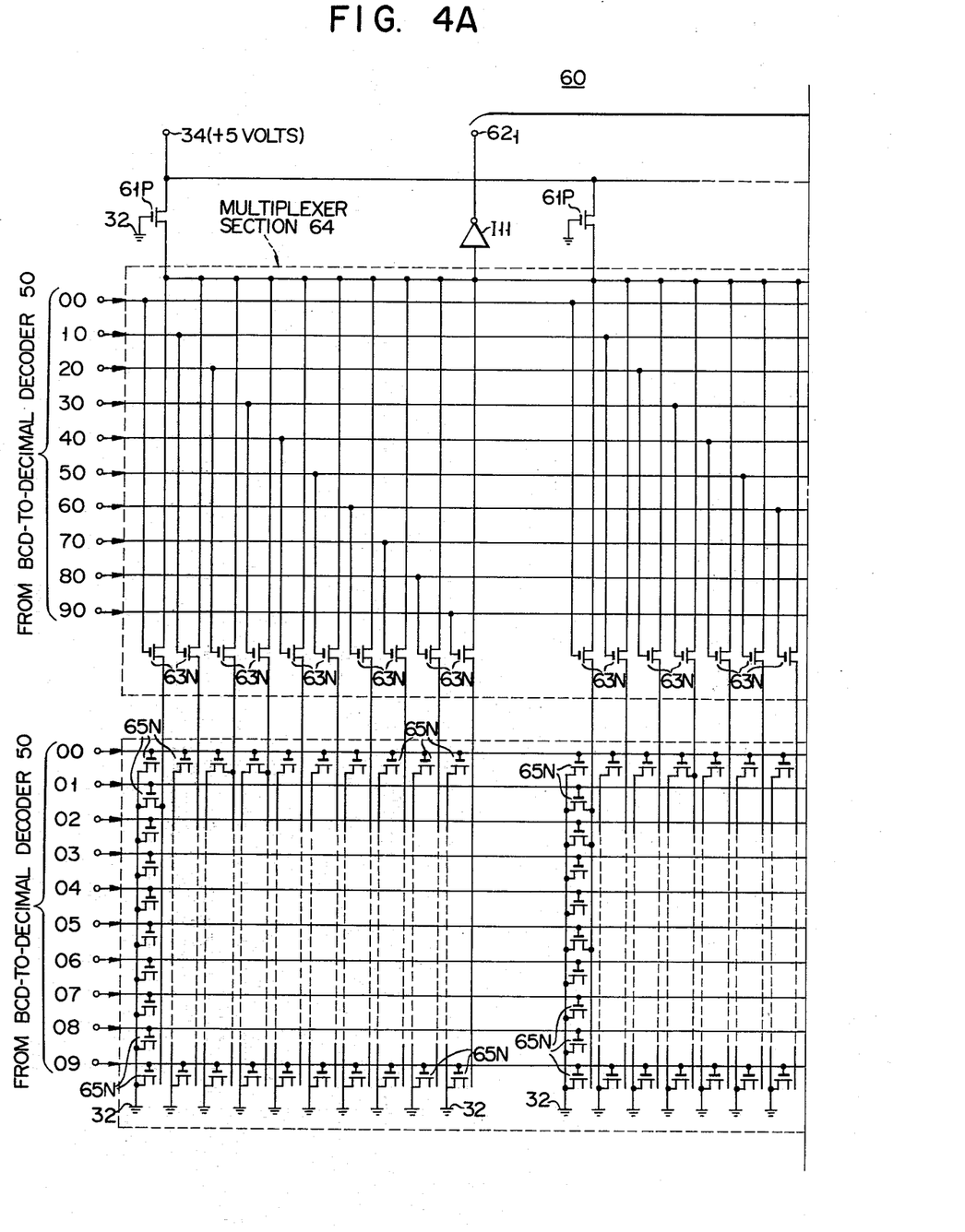
FIGS. 4A and 4B jointly show a fractional detailed practical circuit arrangement of the body of the read-only memory operated by an output signal from the BCD-to-decimal decoder of FIG. 3.
Figure 4B:
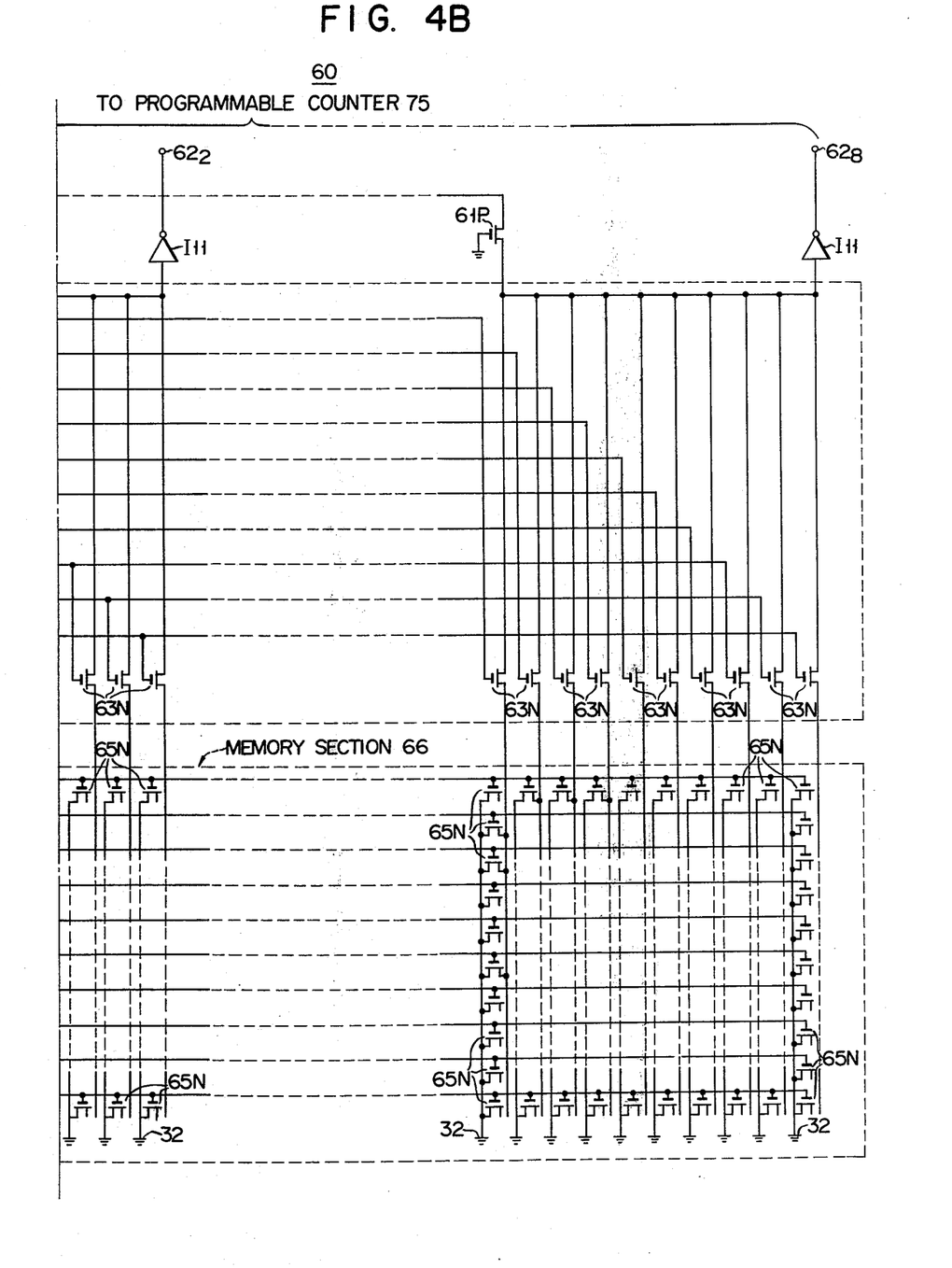
Figure 5:
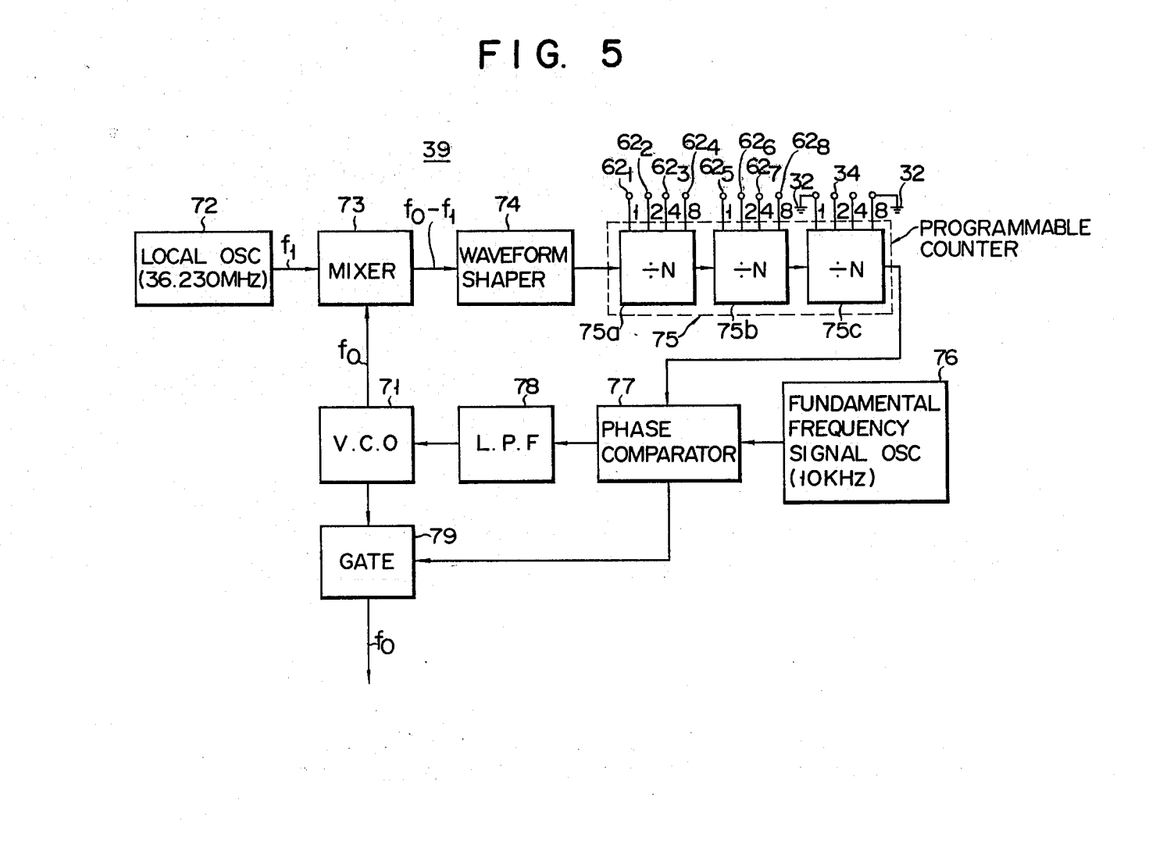
FIG. 5 is a more detailed block diagram of the phase locked loop circuitry of FIG. 2.

BCD signals delivered from the four output terminals of each of the first and second counter stages constituting the BCD counter 37 indicate the required number of repetitive operations of the channel changeover switch 31 which is defined by the specified channel number being selected. These output BCD signals thus obtained from the BCD counter 37 are supplied to a read-only memory device 38 arranged as shown in FIGS. 3 and 4 and converted first into a decimal signal representing the selected channel number and then into a specified code signal (BCD signal in this embodiment) indicating the ratio of a frequency division being supplied to the later described programmable counter 75 included in a PLL circuitry 39 constructed as shown in FIG. 5. The output specified code signal thus obtained from the read-only memory device 38 is supplied to the PLL circuitry 39, thereby producing therefrom a local oscillation signal having a frequency specified for the selected channel to complete the selection of a desired channel.

For the indication of the selected channel number, 4-bit BCD signals delivered from the four output terminals of each of the front and rear stages constituting the BCD counter 37 are supplied to two conventional 7-segment display devices 42 and 43 each formed of seven light emission diode or liquid crystal segments arranged in a pattern of a numeral "8" through the corresponding conventional decoder-driver circuits 40 and 41.

FIG. 3 shows a practical logic circuit arrangement of a BCD-to-decimal decoder 50 included in the read-only memory device 38 of FIG. 2. This BCD-to-decimal decoder 50 comprises ten load P-channel field effect transistors 52P whose source-drain paths are connected between a positive DC source line 34 having a voltage of about +5 volts and ten output lines $51_1$ to $51_{10}$, and whose gates are connected to a grounded negative DC source terminal 32; and a plurality of N-channel field effect transistors 54N, two gates of which are each connected through one inverter $I_1$ or two series-connected inverters $I_1$ and $I_2$ to the predetermined one of four input terminals $53_1$ to $53_4$ which are connected to the first or second stage output terminals of the BCD counter 37 of FIG. 2, the drains of which are connected to the predetermined one of the ten output lines $51_1$ to $51_{10}$, and the sources of which are connected to the grounded negative DC source terminal 32.

The BCD-to-decimal decoder 50 arranged as described above can produce, as is well known to those skilled in the art, decoded decimal signals denoting the predetermined one of decimal numerals of 0 to 9 of the first place or decimal numerals of 00 to 90 of the second place in response to the BCD signals applied to the four input terminals $53_1$ to $53_4$ from the ten output lines $51_1$ to $51_{10}$.

Fig. 4 is a schematic practical logic circuit arrangement of the memory body 60 included in the read-only memory device 38 of FIG. 2. This memory body 60 has such arrangement that it is supplied with output decoded decimal signals from the two BCD-to-decimal decoders 50 of FIG. 3 (these decoders are of the identical arrangement and only one of them is indicated for simplification of illustration and convenience of description) and delivers binary coded decimal signals representing the ratio of frequency division by the programmable counter 75 of FIG. 5 included in the PLL circuitry 39 for generating a local oscillation signal having a frequency assigned to a selected channel by selective operation of the channel changeover switch 31.

The read-only memory body 60 comprises a predetermined number (eight in this embodiment) of multiplexer sections 64 each comprising 10 N-channel field effect transistors 63N, the gates of which are each connected to the corresponding one of the ten output lines $53_1$ to $53_{10}$ of the BCD-to-decimal decoder 50 (see FIG. 3) for delivering any digit of decimal numerals of the second place, and the drains of which are jointly connected to the positive DC source terminal 34 through the source-drain path of a load P-channel field effect transistor 61P, whose gate is connected to the grounded negative DC source terminal 32, the commonly connected gates of said N-channel field effect transistors 63N being also connected to an output terminal $62_1$, $62_2$ ... or $62_8$ (FIG. 5) which in turn is connected to the corresponding one of twelve terminals for determining the ratio of a frequency division of the programmable counter 75 through a respective inverter $I_{11}$; and eight memory sections 66 each comprising one hundred N-channel field effect transistors 65 arranged in a matrix form of 10 columns and 10 rows, the gates of which are each connected to the corresponding one of the output lines $53_1$ to $53_{10}$ of the BCD-to-decimal decoder 50 (FIG. 3) for delivering any digit of decimal numerals of the first place, the sources of which are each connected to the grounded negative DC source terminal 32, and the drains of which are selectively connected to the corresponding sources of the ten field effect transistors 63N in accordance with a predetermined memory pattern (said selective connection is fractionally indicated in FIG. 4).

With the read-only memory body 60 having the abovementioned arrangement, when those of the above-mentioned one hundred field effect transistors 65N disposed in the matrix formed memory addresses of $10 \times 10 = 100$ of each memory section 66 which are designated by output BCD signals from the two BCD-to-decimal decoders 50 whose contents are defined by the selective operation of the channel changeover switch 31 each have a completely connected circuit relationship, with the remaining field effect transistors 65N kept in an open circuit relationship, then the eight output terminals $62_1$ to $62_8$ produce a desired BCD signal.

FIG. 5 is a more detailed block circuit diagram of the PLL circuitry 39 of FIG. 2. The PLL circuitry 39 includes a voltage controlled oscillator 71 for generating a local oscillation signal having a frequency (Table 1) assigned to a selected channel upon selective operation of the channel changeover switch 31. An output local oscillation signal $f_0$ from the voltage controlled oscillator 71 is supplied to a mixer 73 together with a local oscillation signal from a local oscillator 72, the frequency $f_1$ of which is determined by the following equation:

$$f_1 = f_0 - n \cdot f_2 \ldots \quad 1$$

The character $n$ given in the above equation (1) denotes the ratio (Table 2) in which the programmable counter 75 divides its input signal frequency for a selected channel according to the contents of BCD signals supplied to said counter 75 from the output terminals $62_1$ to $62_8$ of the memory body 60 (FIG. 4) through selective operation of the channel changeover switch 31. The character $f_2$ represents a frequency equal to a minimum interval between the transmission-reception signal frequencies assigned to the respective channels. In this embodiment, $f_2$ is 10 KHz and in consequence $f_1$ is 36.230 MHz.

Table 2

| Channel No. | Outputs of Read-only Memory 38 | | | | | | | | Ratio of frequency division by programmable counter 75 |
|---|---|---|---|---|---|---|---|---|---|
| | $62_8$ | $62_7$ | $62_6$ | $62_5$ | $62_4$ | $62_3$ | $62_2$ | $62_1$ | |
| 1 | 0 | 0 | 0 | 0 | 0 | 0 | 0 | 1 | 201 |
| 2 | 0 | 0 | 0 | 0 | 0 | 0 | 1 | 0 | 202 |
| 3 | 0 | 0 | 0 | 0 | 0 | 0 | 1 | 1 | 203 |
| 4 | 0 | 0 | 0 | 0 | 0 | 1 | 0 | 1 | 205 |
| 5 | 0 | 0 | 0 | 0 | 0 | 1 | 1 | 0 | 206 |
| 6 | 0 | 0 | 0 | 0 | 0 | 1 | 1 | 1 | 207 |
| 7 | 0 | 0 | 0 | 0 | 1 | 0 | 0 | 0 | 208 |
| 8 | 0 | 0 | 0 | 1 | 0 | 0 | 0 | 0 | 210 |
| 9 | 0 | 0 | 0 | 1 | 0 | 0 | 0 | 1 | 211 |
| 10 | 0 | 0 | 0 | 1 | 0 | 0 | 1 | 0 | 212 |
| 11 | 0 | 0 | 0 | 1 | 0 | 0 | 1 | 1 | 213 |
| 12 | 0 | 0 | 0 | 1 | 0 | 1 | 0 | 1 | 215 |
| 13 | 0 | 0 | 0 | 1 | 0 | 1 | 1 | 0 | 216 |
| 14 | 0 | 0 | 0 | 1 | 0 | 1 | 1 | 1 | 217 |
| 15 | 0 | 0 | 0 | 1 | 1 | 0 | 0 | 0 | 218 |
| 16 | 0 | 0 | 1 | 0 | 0 | 0 | 0 | 0 | 220 |
| 17 | 0 | 0 | 1 | 0 | 0 | 0 | 0 | 1 | 221 |
| 18 | 0 | 0 | 1 | 0 | 0 | 0 | 1 | 0 | 222 |
| 19 | 0 | 0 | 1 | 0 | 0 | 0 | 1 | 1 | 223 |
| 20 | 0 | 0 | 1 | 0 | 0 | 1 | 0 | 1 | 225 |
| 21 | 0 | 0 | 1 | 0 | 0 | 1 | 1 | 0 | 226 |
| 22 | 0 | 0 | 1 | 0 | 0 | 1 | 1 | 1 | 227 |
| 23 | 0 | 0 | 1 | 1 | 0 | 0 | 0 | 0 | 230 |

Thus, the mixer 73 generates due to the beat phenomenon a signal whose frequency is equal to a difference between the frequency $f_0$ of an output signal from the voltage controlled oscillator 71 and the frequency $f_1$ of an output signal from the local oscillator 72. An output signal from the mixer 73 is conducted to the programmable counter 75 through a waveform shaper 74 provided, if necessary. As the result, the programmable counter 75 divides the frequency of its input signal supplied from the mixer 73 in the ratio (Table 2) determined by BCD signals whose counters are defined by a selected channel and which are supplied to said counter 75 from the output terminals $62_1$ to $62_8$ (FIG. 4) of the read-only memory device 38. According to this embodiment, the programmable counter 75 is supposed to divide its input signal frequency in the ratio of 201 for the first channel, and divide other input signal frequencies for the second and subsequent channels automatically in the ratios as listed in Table 2, with the frequency division ratio for the 23rd or last channel set at 230. With this embodiment, the programmable counter 75 is, therefore, constructed of three cascaded frequency dividers 75a, 75b and 75c. The ratios of frequency division by the first and second stage frequency dividers 75a and 75b are controlled by BCD signals which are supplied to the four input terminals of each of said dividers 75a and 75b for receiving four signals having binary weights of 1, 2, 4 and 8 respectively from the corresponding ones of the output terminals $62_1$ to $62_8$ of the read-only memory device 38, said BCD signals having different contents, as shown in Table 2, in accordance with selected channels. The third or last stage frequency divider 75c always divides its input signal frequencies in the ratio of 2. consequently, the input terminals for receiving signals having binary weights of 1, 4 and 8 are connected to the grounded negative DC source terminal 32, and the remaining input terminal for receiving a signal having a binary weight of 2 is connected to the positive DC source terminal 34. An output signal thus obtained from the programmable counter 75 is supplied to a phase comparator 77 together with an output signal from a fundamental frequency signal oscillator 76 which is designed to generate a signal having a frequency equal to a minimum interval (10 kHz in this embodiment) between the frequencies of transmission-reception signals assigned to the respective channels. The phase comparator 77 acts to compare the phase of an output signal from the programmable counter 75 with that of an output signal from the fundamental frequency signal oscillator 76 and produce a voltage signal having an effective pulse width in response to a phase difference between both input signals. An output signal thus obtained from the phase comparator 77 is delivered to the voltage controlled oscillator 71, after converted into DC voltage signal having a level in response to the aforesaid effective pulse width through a low pass filter 78.

The operation of the PLL circuitry 39 arranged as shown in FIG. 5 will now be described. As previously described, the programmable counter 75 produces an output signal having a frequency (generally 10 kHz ±1.5 kHz) deviated by a certain amount from 10 kHz upon selective operation of the channel changeover switch 31. The phase of an input signal from the programmable counter 75 is compared by the phase comparator 77 with that of a 10 kHz output signal of very high precision from the fundamental frequency signal oscillator 76. As the result, the phase comparator 77 produces a voltage signal having an effective pulse width corresponding to a phase difference between both input signals. An output voltage signal thus obtained from the phase comparator 77 is conducted to the voltage controlled oscillator 71 after converted into a DC voltage signal having a level in response to the aforesaid effective pulse width through the low pass filter 78 to control the frequency of an oscillation signal being delivered therefrom. Thus, an output signal from the programmable counter 75 is circulated many times through a closed signal transmission loop comprising the phase comparator 77, low pass filter 78, voltage controlled oscillator 71, mixer 73, waveform shaper 74, programmable counter 75 and phase comparator 77, until the phase of the above-mentioned output signal coincides with that of the 10 kHz of high precision from the fundamental frequency signal oscillator 76. At the time of said coincidence, the voltage controlled oscillator 71 gives forth a local oscillation signal $f_0$ of high precision frequency assigned to a selected channel. When closed by an output signal from the phase comparator 77 representing the aforesaid coincidence, a gate circuit 79 allows the passage of a local oscillation signal $f_0$ having a frequency assigned to a selected channel which is produced by the voltage controlled oscillator 71.

A channel-selecting apparatus arranged as shown in FIGS. 1 to 5 has the advantage of enabling any of the channels to be selected by the normally open type channel changeover switch 31 of simplest arrangement constructed of a single movable contact and a single fixed contact. Said apparatus is further provided with the BCD counter 37 and read-only memory device 38 disposed between the channel changeover switch assembly including the switch 31 and the PLL circuitry 39. Said apparatus causes an electric pulse signal to be produced a number of times corresponding to a channel number being selected, each time the channel changeover switch 31 is manipulated. Electric pulse signals thus generated are collectively converted by the two BCD-to-decimal decoders 50 (FIG. 3) included in the read-only memory device 38 into a decimal signal denoting the specified number of a selected channel. Said decimal signal is again converted by the read-only memory body 60 (FIGS. 4A and 4B) included in the read-only memory device 38 into BCD signals for defining the ratio of frequency division by the programmable counter 75 (FIG. 5) included in the PLL circuitry 39. Therefore, the channel-selecting apparatus of this invention is readily applicable to a multichannel transceiver, whether the frequencies of transmission-reception signals assigned to the respective channels are or are not arranged at an equal interval.

Figure 6:
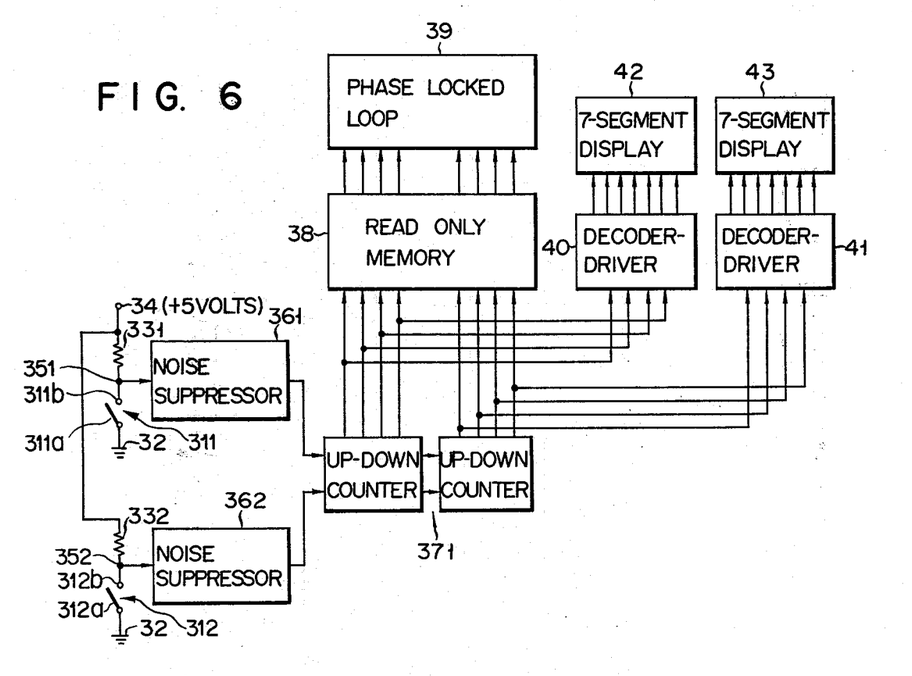
FIGS. 6 to 8 are schematic block circuit diagrams of a channel-selecting apparatus for a multichannel transceiver according to other embodiments of the invention.

FIG. 6 is a block circuit diagram of a channel-selecting apparatus according to another embodiment of this invention for use with a multichannel transceiver.

The embodiment of FIG. 6 has much the same arrangement as that of FIG. 1, excepting that there are provided two channel changeover switches 311 and 312 and that junctions 351 and 352 between the fixed contacts 311b and 312b of the channel changeover switches 311 and 312 and the corresponding resistors 331 and 332 are connected through noise suppressors 361 and 362, provided if necessary, to two input terminals for up and down counts of the up/down counter 371 comprising two cascade connected stages.

With the channel-selecting apparatus arranged as shown in FIG. 6, operation of the channel changeover switch 311 causes channel numbers being selected to be shifted in an up mode as 1, 2, 3 . . . . whereas manipulation of the channel changeover switch 312 causes channel numbers being selected to be transferred in a down mode as 9, 8, 7 . . . . Therefore, the embodiment of FIG. 6 has the advantage over that of FIG. 1 in that channel selection can be carried out more quickly.

Figure 7:
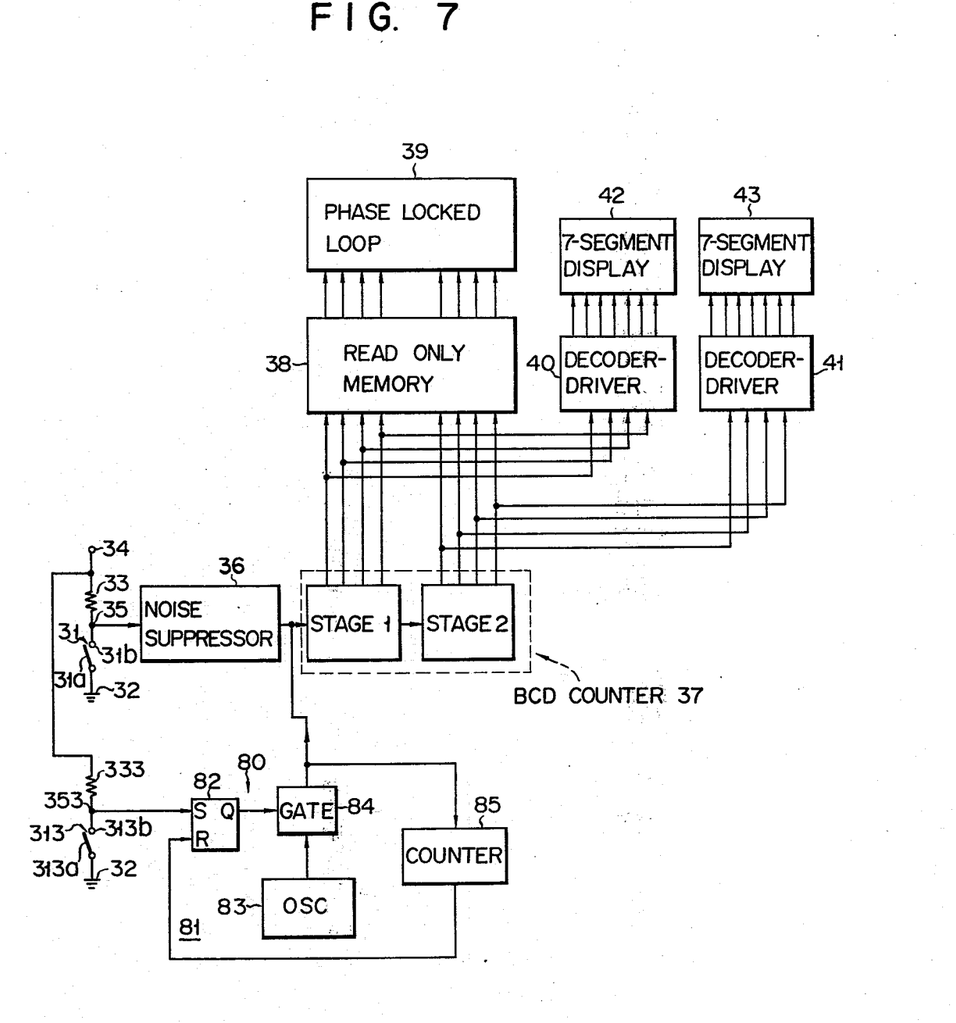

FIG. 7 is a block circuit diagram according to another embodiment of this invention for use with a multichannel transceiver. The embodiment of FIG. 7 has much the same arrangement as that of FIG. 1, excepting that there is provided in addition to the arrangement of the embodiment of FIG. 1 a channel changeover switch assembly 81 comprising a normally open switch 313 having the same construction as the channel changeover switch 31 of FIG. 1 and a circuitry 80 having the undermentioned arrangement.

This circuitry 80 comprises a bistable or R-S flip-flop circuit 82 whose set terminal is connected to a junction 353 between a fixed contact 313b of the switch 313 and a resistor 333; an oscillator 83 for continuously generating a pulse signal having a given frequency, for example, 10 kHz; a gate circuit 84 designed to be rendered conductive while receiving a Q output signal from the flip-flop circuit 82 to supply an output signal from the oscillator 83 to the BCD counter 37; and a counter 85 for counting the number of pulse signals delivered from the oscillator 83 through the gate circuit 84 and giving forth an output signal when counts reach a preset value of, for example, ten, thereby resetting the flip-flop circuit 82. With the channel changeover switch assembly 81 arranged as shown in FIG. 7, operation of the channel changeover switch 313 causes the pulse signals delivered from the oscillator 83 to be conducted to the BCD counter 37 through the gate circuit 84. When applied, therefore, to a transceiver handling channels whose numbers are indicated by decimal numerals of two or more places, the embodiment of FIG. 7 has the advantage over that of FIG. 1 in that channel selection can be effected more quickly. Namely, where channels being selected are as many as twenty-three, the embodiments of FIG. 7 only requires the channel changeover switches 313 and 311 to be operated twice, though the embodiment of FIG. 1 requires the channel changeover switch 31 to be operated twenty-two times.

Figure 8:
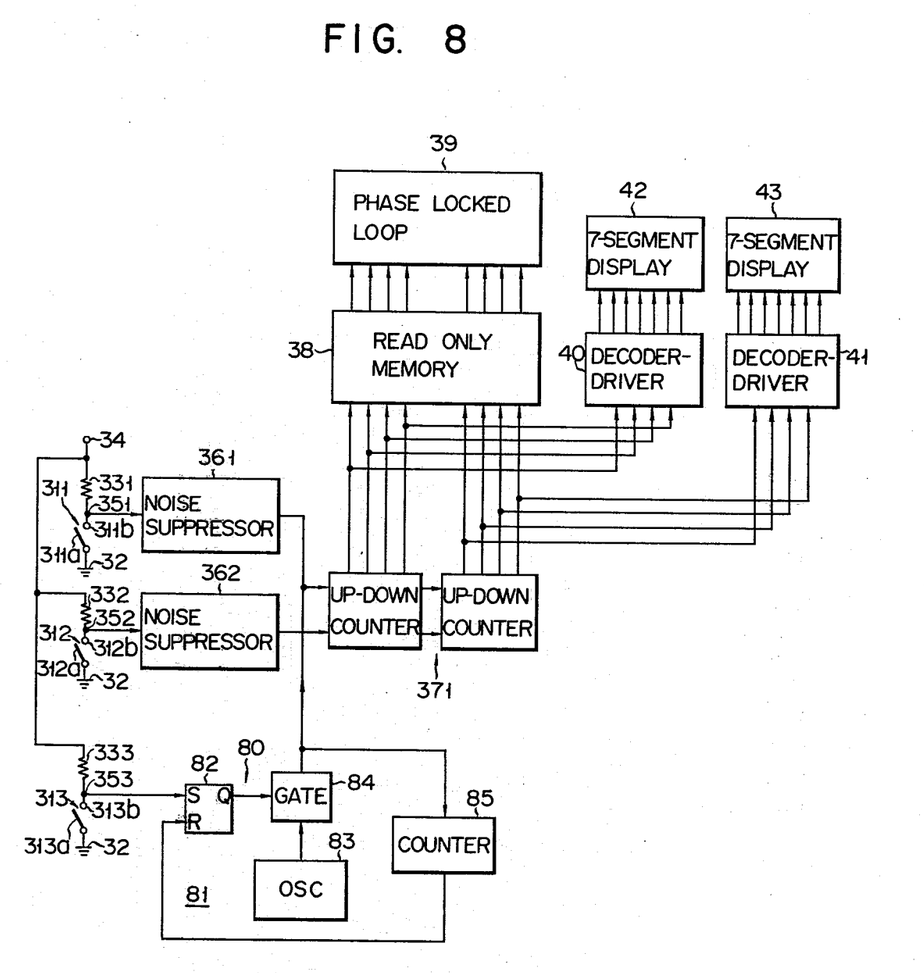

FIG. 8 is a block circuit diagram of a channel-selecting apparatus according to still another embodiment of this invention for use with a multichannel transceiver. The embodiment of FIG. 8 has an arrangement equivalent to a combination of those of FIGS. 6 and 7. Therefore, the embodiment of FIG. 8 has the advantage of quickly selecting any desired one of a plurality of channels whether their number is large or small.

The parts of FIGS. 6 to 8 corresponding to those of FIG. 1 are denoted by the same numerals, description thereof being omitted.

The prior art channel-selecting apparatus for use with a multichannel transceiver has its circuit sections formed of separate integrated circuits or its circuit elements constituted by discrete ones. Therefore, the conventional channel-selecting apparatus had the drawbacks that assembly consumed a great deal of time and work, wiring was sometimes subject to errors, and a relatively large amount of electric power was required.

Figure 9:
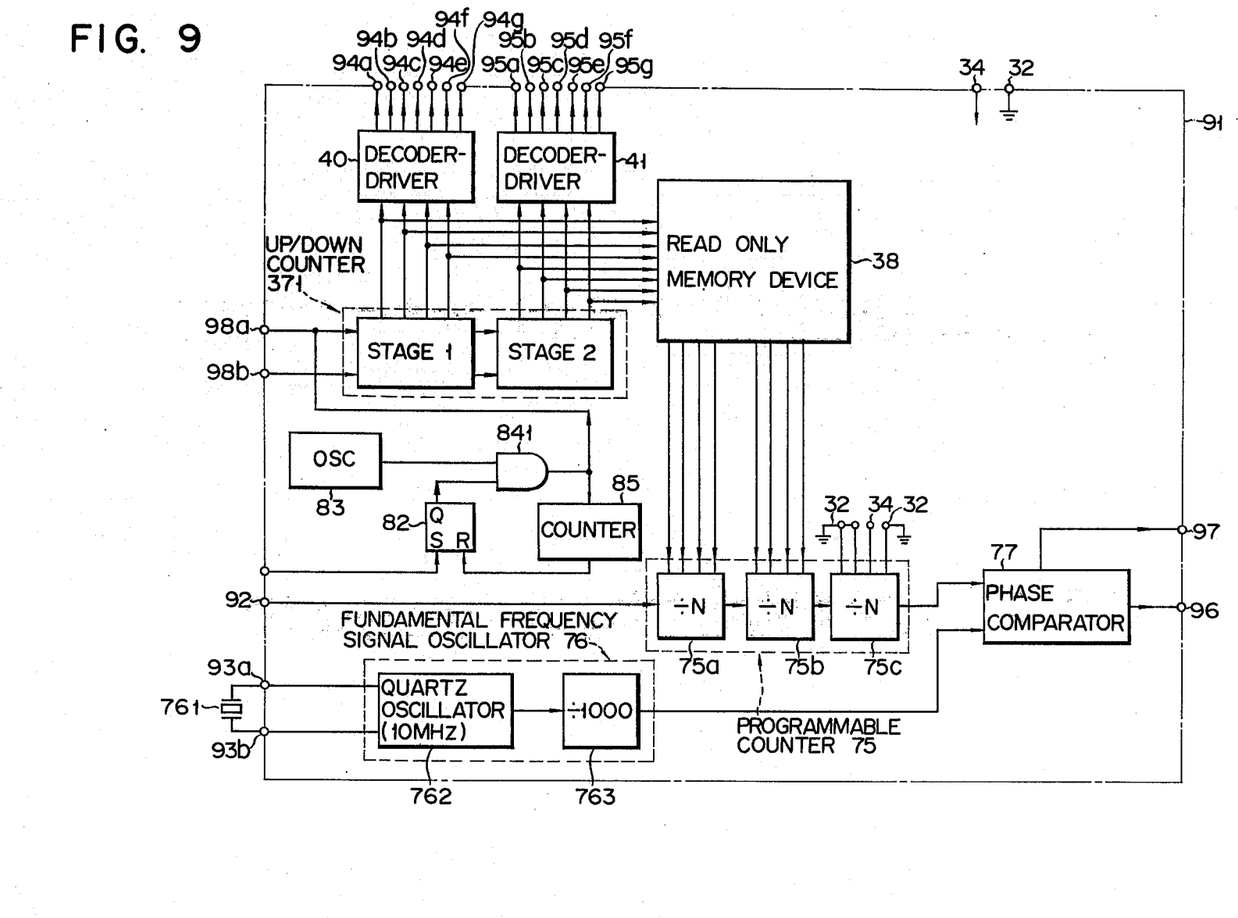
FIG. 9 is a schematic block circuit diagram of the main part of a channel-selecting apparatus according to the embodiment of FIG. 8 for a multichannel transceiver when formed into an integrated circuitry according to the invention.
Figure 10:
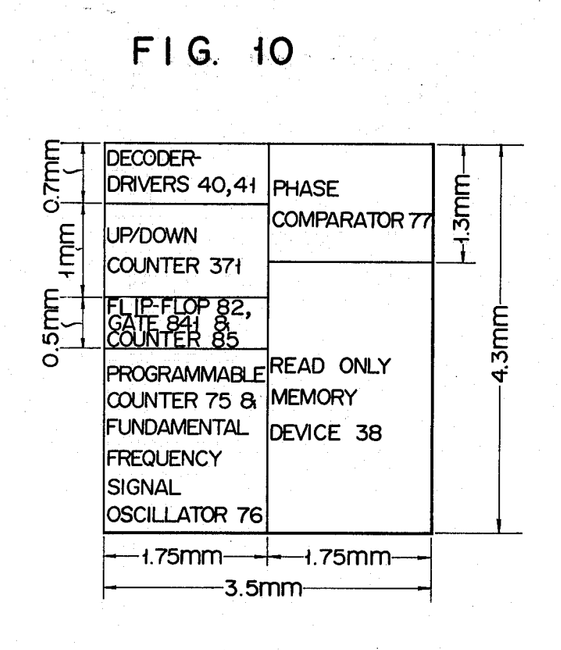
FIG. 10 schematically shows the relative spaces occupied by the various circuit blocks of FIG. 9 on a semiconductor chip.

With this invention, however, the main circuit sections of the channel-selecting apparatus according to the embodiment of FIG. 8 are formed into an integrated circuit on a semiconductor chip 91. This semiconductor integrated circuit chip 91 has a measurement of, for example 4.3 mm in length and 3.5 mm in width, as illustrated in FIG. 10. Integrated on said chip 91 are the oscillator 81, R-S flip-flop circuit 82, NAND gate 841 forming the gate circuit 84, counter 85, up/down counter 371, decoder-driver circuits 40 and 41, read-only memory device 38, fundamental frequency signal oscillator 76 comprising a 10 MHz quartz oscillator 762 including an externally fitted quartz crystal element 761 and one one-thousandth frequency divider 763, programmable counter 75 formed of three cascaded frequency dividers 75a, 75b and 75c, and phase comparator 77. All these elements have relative spaces and arrangement as shown in FIG. 10. The integrated circuit chip 91 is further provided with twenty-four input and output pins acting as the positive and grounded negative DC source terminals 34 and 32; an input terminal of the programmable counter 75 for receiving an output signal from the waveform shaper 74; terminals 93a and 93b by which the quartz crystal element 761 is externally fitted to the chip 91; seven output terminals 94a to 94g of the decoder-driver circuit 40 connected to the 7-segment display device 42; seven output terminals 95a to 95g of the decoder-driver circuit 41 connected to the 7-segment display device 43; the output terminal 96 of the phase comparator 77 connected to the input terminal of the low pass filter 78; the terminal 97 of a phase lock monitor included in the phase comparator 77 (in FIG. 5 said terminal 97 is connected to the gate circuit 79); the input terminals 98a and 98b of the up/down counter 371 for up and down counting respectively; and the set terminal 99 of the R-S flip-flop circuit 82 connected to the junction 353 between the fixed contact 313b of the switch 313 and the resistor 333.

Figure 11:
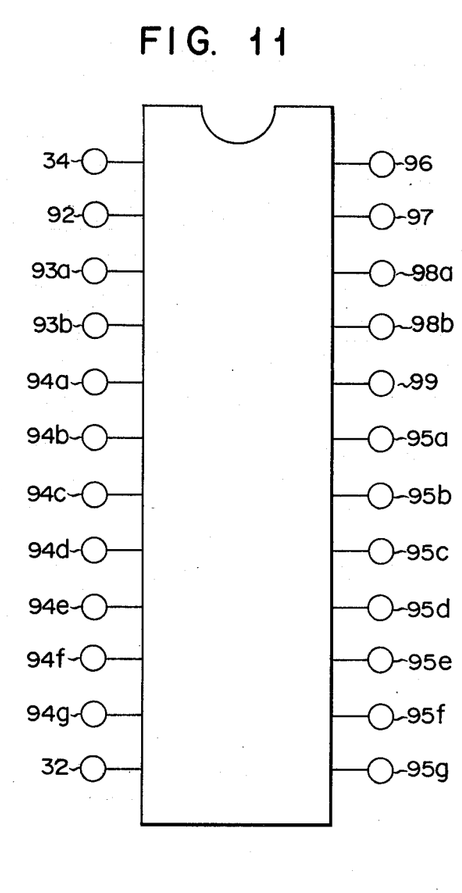
FIG. 11 is a top view of the input and output terminal pins of the circuit blocks arranged on the semiconductor chip as indicated in FIG. 10.

The present channel-selecting apparatus comprising the semiconductor integrated circuit chip 91 equipped with the above-mentioned arrangement has a prominent advantage over the prior art channel-selecting apparatus in that assembly is more simplified, wiring errors and power consumption are more decreased, and the size of the present apparatus is rendered more compact.

Obviously, this invention is not only applicable to a channel-selecting apparatus of the aforesaid arrangement, but also to any other type substantially common in technical concept.

With the foregoing embodiments, the channel changeover switch consisted of a normally open type, but may be formed of a normally closed type. Even in the latter case, this invention can be practised in the same manner and with the same effect as in all the preceding embodiments. It will be noted, however, that in the latter case, electric pulse signals generated upon operation of the channel changeover switch have an opposite polarity to those obtained in the aforesaid embodiments, namely, said electric pulse signals are of positive-going type. Further, the channel changeover switch used in the above-mentioned embodiments may be disposed far apart for remote control from the channel-selecting apparatus.

What is claimed is:

1. A channel-selecting apparatus for a multichannel transceiver which comprises:
channel changeover switch means including a first switch assembly operative to generate an electric pulse signal each time it is operated and a second switch assembly for producing a specified number of electric pulse signals each time it is operated;
counter means coupled with the switch means to count electric pulse signals delivered therefrom;
said second switch assembly comprising a normally open switch which includes a fixed contact and a movable contact, one of said contacts being connected to a DC power source; a bistable circuit whose set terminal is connected to the other contact of the normally open switch; an oscillator operative to generate a signal having a specified frequency; a gate circuit coupled with said oscillator, counter means and bistable circuit to allow the passage of a signal from the oscillator to the counter means only while the bistable circuit is set; and a further counter coupled with the gate circuit and bistable circuit to count signals delivered from the oscillator through the gate circuit and reset the bistable circuit when the count made by said further counter reaches a predetermined value;

a read-only memory device provided with at least as many memory addresses as channels being selected and coupled with the counter means and having its memory addresses representing selected channel numbers designated by the counts made by the counter means; and a phase locked loop circuit coupled with the read-only memory device to generate a local oscillation signal having a frequency assigned to any channel being selected in response to a specified output code signal delivered from the read-only memory device in accordance with the designated address thereof.

2. The channel-selecting apparatus according to claim 1, wherein said counter means comprises an up/down counter; and said switch means comprises two switch units coupled to said counter for up and down counting respectively.

3. The channel-selecting apparatus according to claim 1, comprising a noise suppressor coupled between said switch means and counter means to eliminate noise components arising upon operation of the switch means.

4. The channel-selecting apparatus according to claim 1 further comprising at least one 7-segment display device having the segments arranged substantially in the form of a numeral "8" and displaying any channel number selected by the operation of the switch means; and a decoder-driver coupled between said counter means and display device for selectively actuating respective segments of said display device.

5. The channel-selecting apparatus according to claim 1, wherein at least said counter means, said read-only memory device and the digital section of said phase locked loop circuit are collectively arranged as an integrated circuit on a semiconductor chip.

6. The channel-selecting apparatus according to claim 1 wherein said first switch assembly of said switch means includes a normally open switch comprising a fixed contact and a movable contact, one contact of which is connected to a DC source.

7. The channel-selecting apparatus according to claim 6 wherein said DC source is a positive source.

8. The channel-selecting apparatus according to claim 1, wherein said phase locked loop circuit comprises a voltage controlled oscillator operative to produce for each channel a local oscillation signal whose frequency varies with the level of an input voltage; an oscillator operative to generate a signal having a predetermined higher frequency than a given minimum interval between the frequencies of transmission-reception signals assigned to the respective channels; a mixer supplied with output signals from the oscillator and the voltage controlled oscillator to derive a signal whose frequency is equal to a difference between the frequencies of signals delivered from the oscillator and the voltage controlled oscillator or a sum of said frequencies; a programmable counter coupled with the mixer and said read-only memory device to divide the frequency of an output signal from the mixer in the ratio defined by a specified code signal delivered from said read-only memory device; a fundamental frequency signal oscillator operative to generate a signal whose frequency is equal to a given minimum interval between the frequencies of transmission-reception signals assigned to the respective channels; a phase comparator supplied with output signals from the fundamental frequency signal oscillator and programmable counter to compare the phases of said output signals and to supply the voltage controlled oscillator with a voltage whose level corresponds to a phase difference determined by said comparison; and a further gate circuit coupled with the voltage controlled oscillator and phase comparator to allow the passage of an output signal from the voltage controlled oscillator as a local oscillation signal for a selected channel when the phase comparator determines a difference between the phases of the output signals from the programmable counter and fundamental frequency signal oscillator to be zero.

9. The channel-selecting apparatus according to claim 8, further comprising a filter coupled between said phase comparator and voltage controlled oscillator to filter out high frequency components contained in an output signal from said phase comparator whose effective pulse width varies with a difference between the phases of output signals from the programmable counter and fundamental frequency signal oscillator.

10. The channel-selecting apparatus according to claim 8, further comprising a waveform shaper coupled between said mixer and programmable counter to eliminate noise components contained in an output signal from said mixer.

11. A channel-selecting apparatus for a multi-channel transceiver which comprises:

channel changeover switch means including a first switch assembly operative to generate an electric pulse signal each time it is operated;

counter means coupled with the switch means to count electric pulse signals delivered therefrom;

a read-only memory device provided with at least as many memory addresses as channels being selected and coupled with the counter means and having its memory addresses representing selected channel numbers designated by the counts made by the counter means; and a phase locked loop circuit coupled with the read-only memory device to generate a local oscillation signal having a frequency assigned to any channel being selected in response to a specified output code signal delivered from the read-only memory device in accordance with the designated address thereof;

said phase locked loop circuit comprising a voltage controlled oscillator operative to produce for each channel a local oscillation signal whose frequency varies with the level of an input voltage; an oscillator operative to generate a signal having a predetermined higher frequency than a given minimum interval between the frequencies of transmission-reception signals assigned to the respective channels; a mixer supplied with output signals from the oscillator and the voltage controlled oscillator to derive a signal whose frequency is equal to a difference between the frequencies of signals delivered from the oscillator and the voltage controlled oscillator or a sum of said frequencies; a programmable counter coupled with the mixer and said read-only memory device to divide the frequency of an output signal from the mixer in the ratio defined by a specified code signal delivered from said read-only memory device; a fundamental frequency signal oscillator operative to generate a signal whose frequency is equal to a given minimum interval between the frequencies of transmission-reception signals assigned to the respective channels; a phase comparator supplied with output signals from the fundamental frequency signal oscillator and programmable counter to compare the phases of said output signals and to supply the voltage controlled oscillator with a voltage whose level corresponds to a phase difference determined by said comparison; and a gate circuit coupled with the voltage controlled oscillator and phase comparator to allow the passage of an output signal from the voltage controlled oscillator as a local oscillation signal for a selected channel when the pahse comparator determines a difference between the phases of the output signals from the programmable counter and fundamental frequency signal oscillator to be zero.

12. The channel-selecting apparatus according to claim 11, wherein said switch means coupled with said counter means further includes a second switch assembly for producing a specified number of electric pulse signals each time it is operated.

13. The channel-selecting apparatus according to claim 11, further comprising a filter coupled between said phase comparator and voltage controlled oscillator to filter out high frequency components contained in an output signal from said phase comparator whose effective pulse width varies with a difference between the phases of output signals from the programmable counter and fundamental frequency signal oscillator.

14. The channel-selecting apparatus according to claim 11, further comprising a waveform shaper coupled between said mixer and programmable counter to eliminate noise components contained in an output signal from said mixer.

15. The channel-selecting apparatus according to claim 11, wherein said counter means comprises an up/down counter; and said switch means comprises two switch units coupled to said counter for up and down counting respectively.

16. The channel-selecting apparatus according to claim 11, comprising a noise suppressor coupled between said switch means and counter means to eliminate noise components arising upon operation of the switch means.

17. The channel-selecting apparatus according to claim 11 further comprising at leat one 7-segment display device having the segments arranged substantially in the form of a numeral "8" and displaying any channel number selected by the operation of the switch means; and a decoder-driver coupled between said counter means and display device for selectively actuating respective segments of said display device.

18. The channel-selecting apparatus according to claim 11, wherein at least said counter means, said read-only memory device and the digital section of said phase locked loop circuit are collectively arranged as an integrated circuit on a semiconductor chip.

19. The channel-selecting apparatus according to claim 11 wherein said first switch assembly of said switch means includes a normally open switch comprising a fixed contact and a movable contact, one contact of which is connected to a DC source.

20. The channel-selecting apparatus according to claim 19 wherein said DC source is a positive source.

* * * * *